(12) United States Patent
Hung et al.

(10) Patent No.: US 9,922,882 B1
(45) Date of Patent: Mar. 20, 2018

(54) MANUFACTURING METHOD OF SEMICONDUCTOR STRUCTURE

(71) Applicant: UNITED MICROELECTRONICS CORP., Hsin-Chu (TW)

(72) Inventors: Ching-Wen Hung, Tainan (TW); Yi-Hui Lee, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/595,959

(22) Filed: May 16, 2017

(51) Int. Cl.
*H01L 21/311* (2006.01)
*H01L 21/8234* (2006.01)
*H01L 21/02* (2006.01)

(52) U.S. Cl.
CPC ......... *H01L 21/823475* (2013.01); *H01L 21/02063* (2013.01); *H01L 21/31111* (2013.01); *H01L 21/31116* (2013.01); *H01L 21/31133* (2013.01); *H01L 21/31144* (2013.01); *H01L 21/823418* (2013.01); *H01L 21/823431* (2013.01)

(58) Field of Classification Search
CPC ....... H01L 21/823475; H01L 21/02063; H01L 21/31111; H01L 21/31116; H01L 21/31133; H01L 21/823431
See application file for complete search history.

(56) References Cited

U.S. PATENT DOCUMENTS 7,371,691 B2    5/2008  Hall
8,222,149 B2    7/2012  Chang

*Primary Examiner* — Elias M Ullah
(74) *Attorney, Agent, or Firm* — Winston Hsu

(57) ABSTRACT

A manufacturing method of a semiconductor structure includes the following steps. A substrate is provided, and an epitaxial structure is formed on the substrate. A first dielectric layer covering the epitaxial structure and the substrate is formed. A patterned hard mask layer is formed on the first dielectric layer. A second dielectric layer is formed on the patterned hard mask layer and the first dielectric layer. A patterned photoresist layer is formed on the second dielectric layer. A dry etching process is performed with the pattern hard mask layer and the patterned photoresist layer as masks. The dry etching process forms a contact opening in the first dielectric layer, and the contact opening exposes at least a part of the epitaxial structure. A wet etching process is performed after the dry etching process, and the wet etching process removes the patterned hard mask layer and the second dielectric layer together.

13 Claims, 4 Drawing Sheets

MANUFACTURING METHOD OF SEMICONDUCTOR STRUCTURE

BACKGROUND OF THE INVENTION

1. Field of the Invention

The present invention relates to a manufacturing method of a semiconductor structure, and more particularly, to a manufacturing method of a semiconductor structure for reducing oxidation on an epitaxial structure.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. As the size of the device becomes smaller, the influence of the contact resistance at the interface between the contact structure and the source/drain region on the electrical properties of the device becomes more significant.

In conventional methods of forming contact holes, a photo resist layer serves as an etching mask for etching the underlying interlayer dielectric layer, and an ash process integrated with the dry etching process of forming the contact holes is used to remove the photo resist layer. However, the source/drain region exposed by the contact hole tends to be oxidized by the ash process, and the oxidation layer formed on the source/drain region will significantly influence the contact condition between the source/drain region and the contact structure subsequently formed on the source/drain region. In the worst-case scenario, the contact structure cannot be electrically connected with the source/drain region.

SUMMARY OF THE INVENTION

According to the claimed invention, a manufacturing method of a semiconductor structure is provided. The manufacturing method includes the following steps. A substrate is provided, and an epitaxial structure is formed on the substrate. A first dielectric layer covering the epitaxial structure and the substrate is formed. A patterned hard mask layer is formed on the first dielectric layer. A second dielectric layer is formed on the patterned hard mask layer and the first dielectric layer. A patterned photoresist layer is formed on the second dielectric layer. A dry etching process is performed with the pattern hard mask layer and the patterned photoresist layer as masks. The dry etching process forms a contact opening in the first dielectric layer, and the contact opening exposes at least a part of the epitaxial structure. A wet etching process is performed after the dry etching process, and the wet etching process removes the patterned hard mask layer and the second dielectric layer together.

In the manufacturing method of the semiconductor structure in the present invention, the patterned hard mask layer and the second dielectric layer are removed together by the wet etching process, and there will be not any ash process performed to remove the second dielectric layer and/or the patterned photoresist layer. Oxidation on the epitaxial structure may be mitigated, and the contact condition between the epitaxial structure and other conductive structure may be improved accordingly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 are schematic drawings illustrating a manufacturing method of a semiconductor structure according to a first embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6.

DETAILED DESCRIPTION

Figure 1:
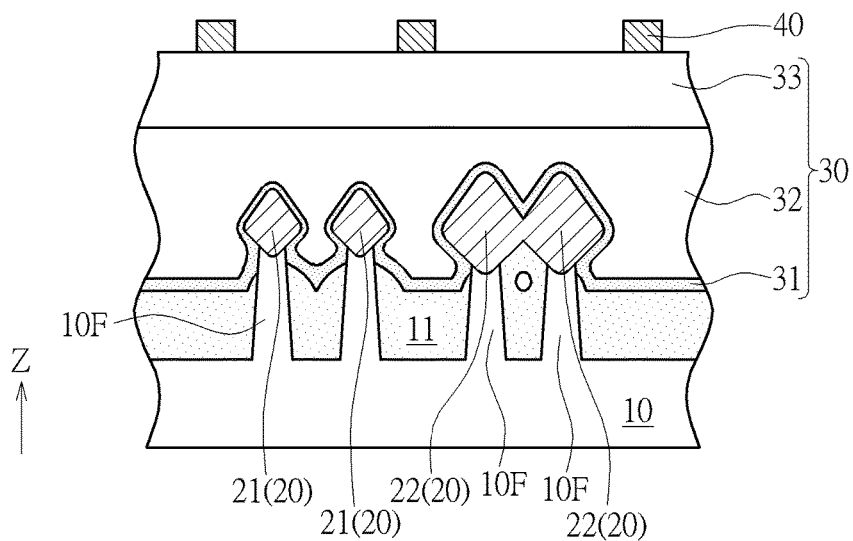
Figure 2:
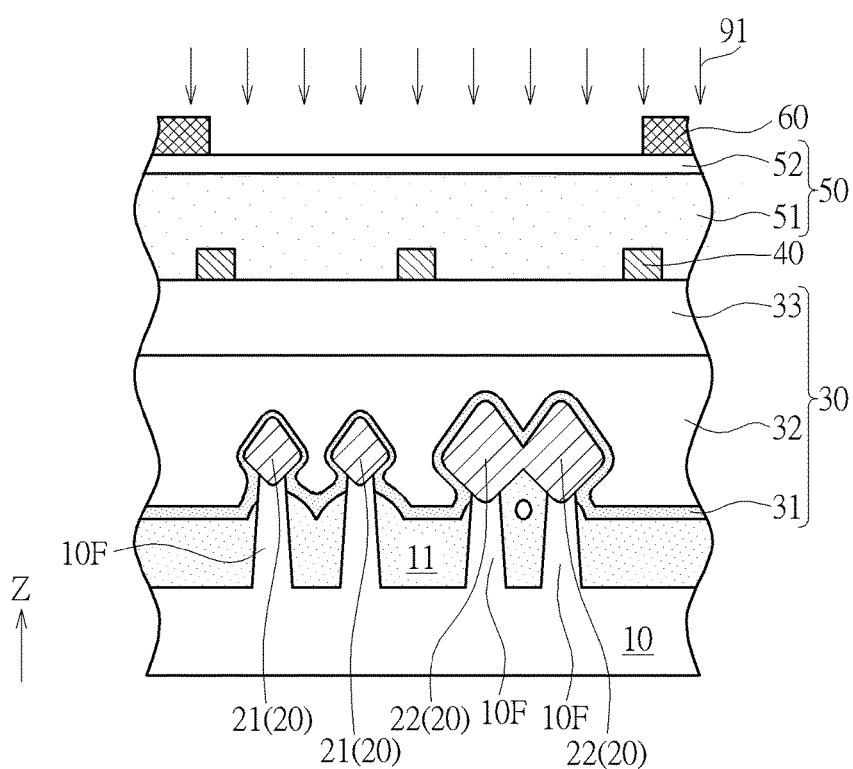

Please refer to FIGS. 1-7. FIGS. 1-7 are schematic drawings illustrating a manufacturing method of a semiconductor structure according to a first embodiment of the present invention. FIG. 2 may be regarded as a schematic drawing illustrating an initial stage of a dry etching process in this embodiment, and FIG. 4 may be regarded as a schematic drawing illustrating an initial stage of a wet etching process in this embodiment. The manufacturing method of the semiconductor structure in this embodiment includes the following steps. As shown in FIG. 1, a substrate 10 is provided. The substrate 10 may include a semiconductor substrate such as a silicon substrate, an epitaxial substrate, a silicon carbide substrate, or a silicon-on-insulator (SOI) substrate, but not limited thereto. An epitaxial structure 20 is formed on the substrate 10. In some embodiments, a standard metal-oxide semiconductor (MOS) transistor process may be performed to form at least one MOS transistor (not shown) or other semiconductor devices on the substrate 10. The MOS transistor could be a PMOS transistor, a NMOS transistor, or a CMOS transistor, and the MOS transistor could also include typical transistor structures including a gate structure, a spacer, a lightly doped drain, source/drain regions and/or salicides. The gate structure may be a polysilicon gate or a metal gate formed by high-k first or high-k last processes. As these processes are well known to those skilled in the art, the details of which are omitted herein for sake of brevity. In some embodiments, the epitaxial structure 20 may be a part of the source/drain region described above or a part of other kinds of semiconductor structures, but not limited thereto. For example, there may be a plurality of epitaxial structures 20 formed on the substrate 10. The epitaxial structures 20 may include first epitaxial structures 21 and second epitaxial structures 22 for source/drain regions of PMOS transistors and NMOS transistors, but not limited thereto. In some embodiments, each of the epitaxial structures may include a silicon phosphate (SiP) epitaxial structure, a silicon germanium (SiGe) epitaxial structure, or epitaxial structure formed by other suitable epitaxial materials. For instance, the first epitaxial structure 21 may be a SiP epitaxial structure, and the second epitaxial structure 22 may be a SiGe structure, but not limited thereto. In some embodiments, the substrate 10 may include a plurality of fin structures 10F, each of the epitaxial structures 20 may be formed on one of the fin structures 10F, and the fin structures 10F may be separated from one another by a shallow trench isolation (STI) 11 formed on the substrate 10. It is worth noting that even though the manufacturing method of this embodiment may be applied to non-planar transistors such as FinFETs, the manufacturing method of the present invention may also be applied to a planar type transistor or other kinds of semiconductor structures.

As shown in FIG. 1, a first dielectric layer 30 covering the epitaxial structures 20 and the substrate 10 is then formed. The first dielectric layer 30 may include layers formed by different materials and stacked in a vertical direction Z. For example, the first dielectric layer 30 may include a contact etching stop layer (CESL) 31 conformally formed on the STI 11 and the epitaxial structures 20, an oxide layer 32 formed on the CESL 31, and a tetraethylorthosilicate (TEOS) layer 33 formed on the oxide layer 32, but the present invention is not limited to this. In some embodiments, the first dielectric layer 30 may include other materials such as ultra-low dielectric constant (ULK) dielectric material, silicon carbide (SiC), or silicon oxynitride (SiON). A patterned hard mask layer 40 is then formed on the first dielectric layer 30. In some embodiments, the patterned hard mask layer 40 may include a metal nitride hard mask layer, such as a titanium nitride (TiN) hard mask layer, but not limited thereto. The patterned hard mask layer 40 may also be formed by other suitable materials, such as a carbon containing material according to other considerations.

Figure 3:
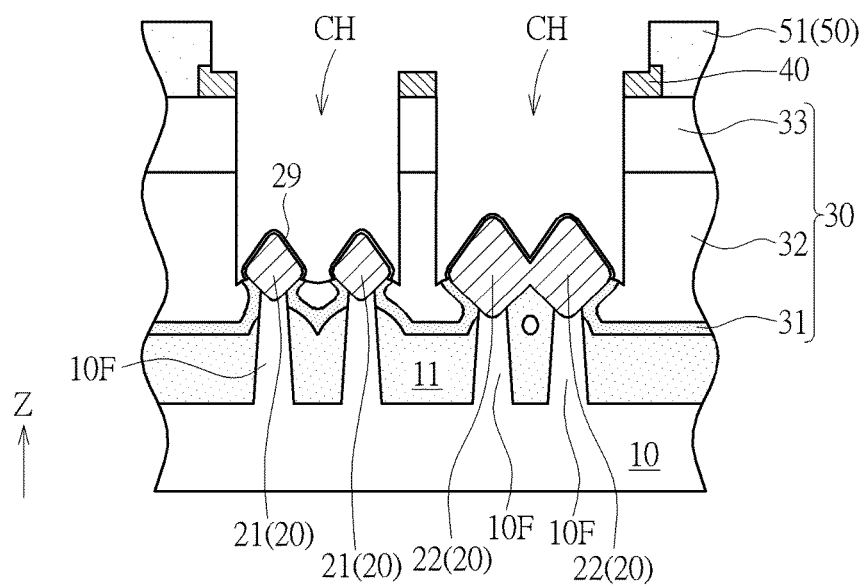

As shown in FIG. 2, a second dielectric layer 50 is then formed on the patterned hard mask layer 40 and the first dielectric layer 30. In some embodiments, the second dielectric layer 30 may be a bottom anti-reflective coating (BARC) including an organic dielectric layer 51 and an anti-reflecting dielectric layer 52. The organic dielectric layer 51 may be regarded as an organic planarization layer, and the anti-reflecting dielectric layer 52 may include a silicon-containing hard mask bottom anti-reflecting coating (SHB), but not limited thereto. The second dielectric layer 50 may also be formed by other suitable anti-reflective materials according to other considerations. A patterned photoresist layer 60 is then formed on the second dielectric layer 60. After the step of forming the patterned photoresist layer 60, a dry etching process 91 is performed with the pattern hard mask layer 40 and the patterned photoresist layer 60 as masks. As shown in FIG. 2 and FIG. 3, the dry etching process 91 forms a contact opening CH in the first dielectric layer 30, and the contact opening CH exposes at least a part of the epitaxial structure 20. In some embodiments, a plurality of the contact openings CH may be formed by the dry etching process 91, and each of the contact openings CH may expose more than one of the epitaxial structures 20, but not limited thereto. In some embodiments, the patterned photoresist layer 60 may be removed by the dry etching process 91, and a part of the second dielectric layer 50 and a part of the patterned hard mask layer 40 may be partially etched by the dry etching process 91, but not limited thereto.

As shown in FIGS. 2-5, a wet etching process 93 is then performed after the dry etching process 91, and the wet etching process 93 removes the patterned hard mask layer 40 and the second dielectric layer 50 together. Specifically, at least a part of the second dielectric layer 50 remains on the substrate 10 at an initial stage of the wet etching process 93, and the patterned hard mask layer 40 and the second dielectric layer 50 are removed by the wet etching process 93. In some embodiments, an etchant used in the wet etching process 93 may include sulfuric acid, hydrogen peroxide, or other appropriate chemicals capable of removing the patterned hard mask layer 40 and the second dielectric layer 50. For example, the etchant used in the wet etching process 93 may be a mixture of sulfuric acid and hydrogen peroxide, such as SPM (sulfuric acid and hydrogen peroxide mixture), but not limited thereto. Because the second dielectric layer 50 and the patterned hard mask layer 40 may be removed together by the wet etching process 93, the second dielectric layer 50 does not have to be removed by an ash process. In other words, there is not any ash process performed in the dry etching process 91, and there is not any ash process performed between the dry etching process 91 and the wet etching process 93. Therefore, an oxidation layer 29 formed on the epitaxial structure 20 will not be too thick, and the contact resistance between the epitaxial structure 20 and a contact structure subsequently formed on the epitaxial structure 20 may be reduced.

Figure 4:
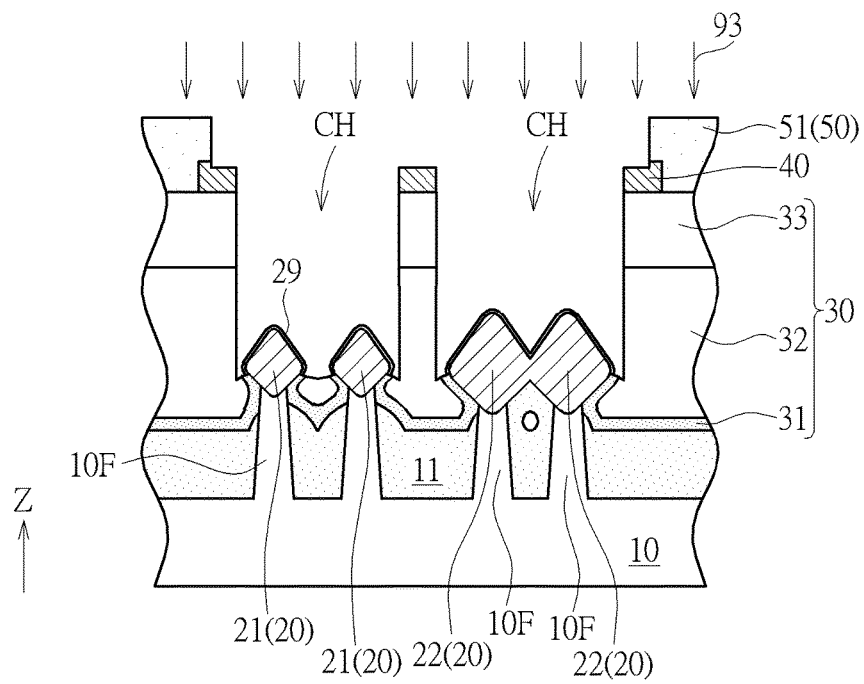
Figure 5:
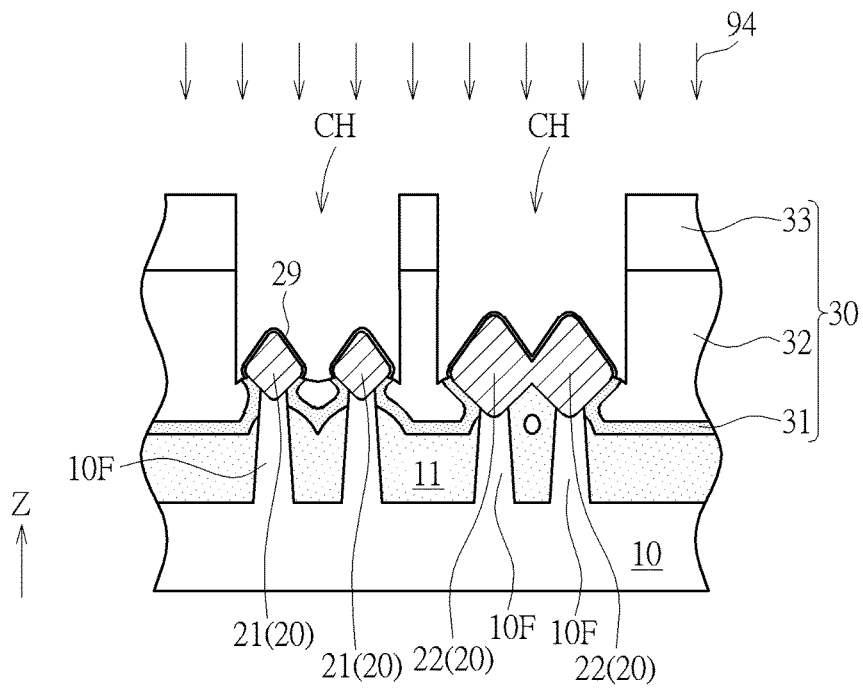
Figure 6:
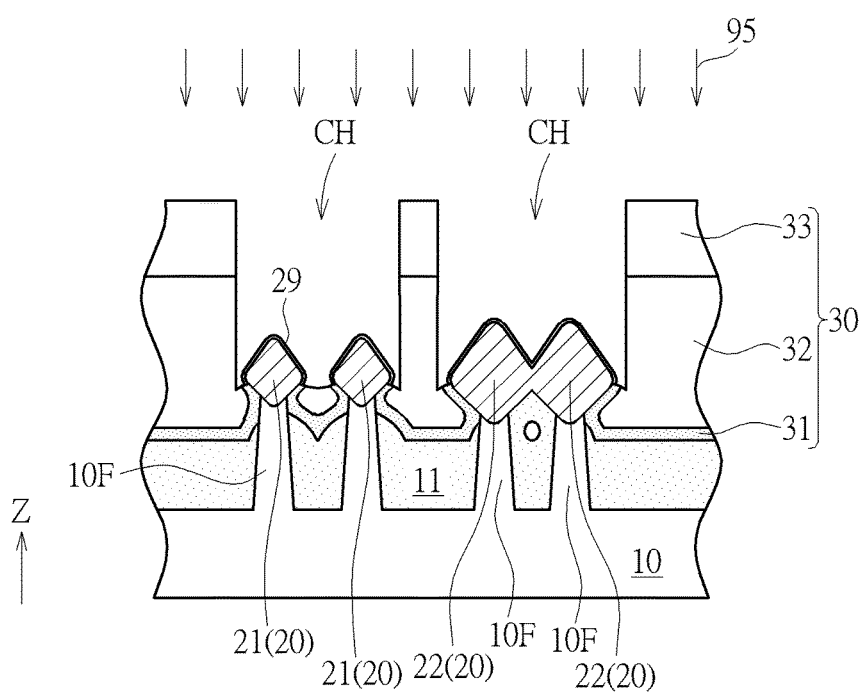
Figure 7:
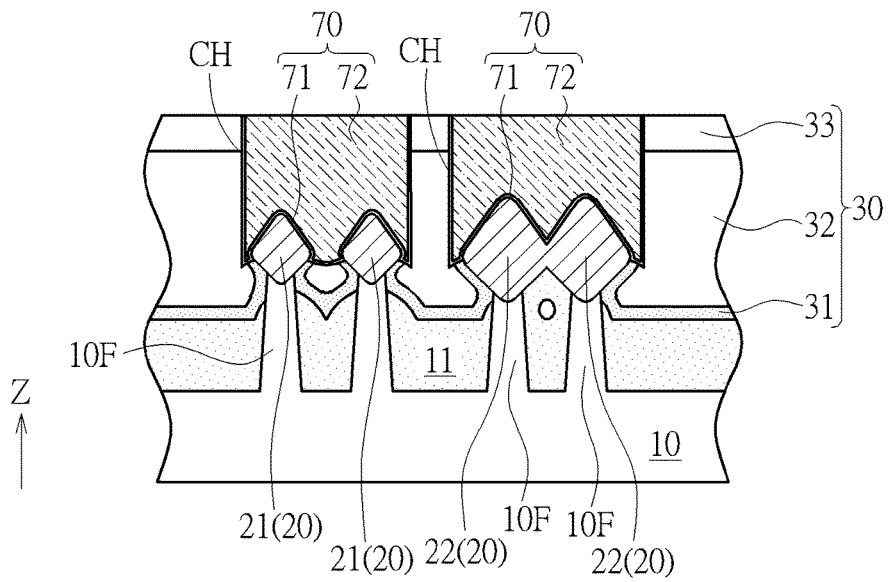

Additionally, as shown in FIG. 4 and FIG. 5, in some embodiments, the manufacturing method may further include performing a first wet clean process 94 after the wet etching process 93. A solution used in the first wet clean process 94 may include ammonium hydroxide, hydrogen peroxide, or other suitable chemicals. For example, the solution used in the first wet clean process 94 may be a mixture of ammonium hydroxide, hydrogen peroxide, and water, and the first wet clean process 94 may be regarded as a standard clean 1 (SC1) process for removing other impurities, but not limited thereto. As shown in FIG. 5 and FIG. 7, a contact structure 70 may be formed in the contact opening CH after the first wet clean process 94, and the contact structure 70 is electrically connected to the corresponding epitaxial structures 20. In some embodiments, the contact structure 70 may include a barrier layer 71 and a low resistivity layer 72. The barrier layer 71 and the low resistivity layer 72 in the contact openings CH and on the first dielectric layer 30 first, and a chemical mechanical polishing (CMP) process may then be performed to remove the barrier layer 71 and the low resistivity layer 72 outside the contact openings CH for forming the contact structures 70. As shown in FIGS. 5-7, in some embodiments, the manufacturing method may further include performing a second wet clean process 95 after the first wet clean process 94 and before the step of forming the contact structure 70, and a solution used in the second wet clean process 95 may include dilute hydrofluoric acid (DHF) or other appropriate chemicals. In addition, before the step of forming the contact structure 70, an etching process such as a SiCoNi etching process or other appropriate dry etching process may be performed to remove at least a part of the oxidation layer 29 formed on the epitaxial structure 20, but not limited thereto. A process gas used in the SiCoNi etching process may include nitrogen trifluoride ($NF_3$) and ammonia ($NH_3$).

It is worth noting that, according to the manufacturing method of the semiconductor structure in this embodiment, the second dielectric layer and the patterned hard mask layer are removed together by the wet etching process, and it not necessary to performed an ash process for removing the second dielectric layer. The thickness of the oxidation layer formed on the epitaxial structure will be reduced, and the contact resistance between the epitaxial structure and the contact structure may be reduced accordingly. Additionally, the critical dimension (CD) uniformity of the contact opening CH and the contact structure 70 may also be improved because the ash process is skipped in the dry etching process of forming the contact opening CH. Therefore, the manufacturing yield may be improved by the manufacturing method of the semiconductor structure in the present invention.

Figure 8:
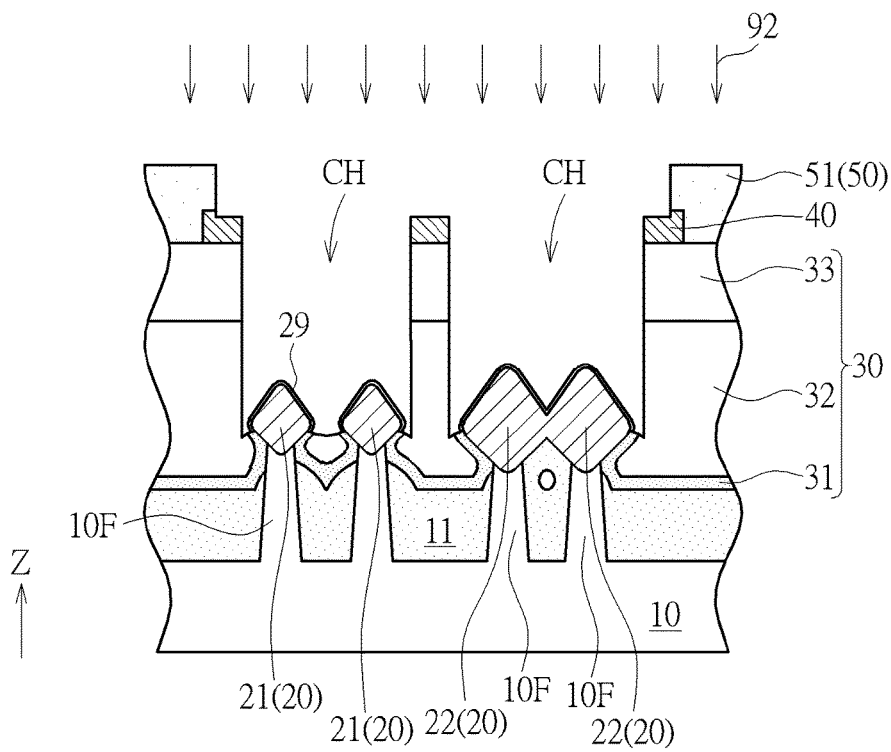
FIG. 8 is a schematic drawing illustrating a manufacturing method of a semiconductor structure according to a second embodiment of the present invention.

Please refer to FIG. 8 and FIGS. 2-4. FIG. 8 is a schematic drawing illustrating a manufacturing method of a semiconductor structure according to a second embodiment of the present invention. FIG. 8 may be regarded as a schematic drawing in a step subsequent to FIG. 3, and FIG. 4 may be regarded as a schematic drawing in a step subsequent to FIG. 8. As shown in FIG. 2, FIG. 3, FIG. 8, and FIG. 4, the manufacturing method in this embodiment may further including performing a pre clean process 92 after the dry etching process 91 and before the wet etching process 93, and a solution used in the pre clean process 92 may include ammonium hydroxide, hydrogen peroxide, or other suitable chemicals. For example, the solution used in the pre clean process 92 may be a mixture of ammonium hydroxide, hydrogen peroxide, and water, and the pre clean process 92 may be regarded as another standard clean 1 (SC1) process performed before the wet etching process 93. As shown in FIG. 8 and FIG. 4, at least a part of the second dielectric layer 50 remains on the substrate 10 after the pre clean process 92 and before the wet etching process 93. In other words, the pre clean process 92 is not used to remove the second dielectric layer 50 and the patterned hard mask layer 40. Additionally, the pre clean process 92 may be used to remove some substances formed on the epitaxial structure 20 and the substance may react with the etchant used in the wet etching process 93 and damage the epitaxial structure 20. For example, when the epitaxial structure 20 includes silicon phosphate, the oxidation layer 29 formed on the epitaxial structure 20 may include phosphorus oxide (such as $P_2O_5$). The phosphorus oxide may become phosphorous acid (such as $H_3PO_4$) after reacting with water and the etchant (such as SPM) of the wet etching process 93, and the epitaxial structure 20 containing silicon phosphate will be damaged by the phosphorous acid. However, when the solution used in the pre clean process 92 includes ammonium hydroxide, the ammonium hydroxide may react with the phosphorus oxide and/or the phosphorous acid, and the damage of the epitaxial structure 20 containing silicon phosphate will be mitigated accordingly. In other words, the manufacturing yield of the semiconductor structure may be further enhanced by introducing the pre clean process 92 after the dry etching process 91 and before the wet etching process 93.

To summarize the above descriptions, according to the manufacturing method of the semiconductor structure in the present invention, the patterned hard mask layer and the second dielectric layer are removed together by the wet etching process without performing an ash process in the dry etching process or between the dry etching process and the wet etching process. The surface oxidation of the epitaxial structure may be mitigated, and the contact resistance between the epitaxial structure and the contact structure may be reduced accordingly. In addition, the CD uniformity of the contact openings and the contact structures may also be improved because the ash process is skipped in the dry etching process of forming the contact opening, and the manufacturing yield may be improved by the manufacturing method of the semiconductor structure in the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor structure, comprising:
   providing a substrate, wherein an epitaxial structure is formed on the substrate;
   forming a first dielectric layer covering the epitaxial structure and the substrate;
   forming a patterned hard mask layer on the first dielectric layer;
   forming a second dielectric layer on the patterned hard mask layer and the first dielectric layer;
   forming a patterned photoresist layer on the second dielectric layer;
   performing a dry etching process with the pattern hard mask layer and the patterned photoresist layer as masks, wherein the dry etching process forms a contact opening in the first dielectric layer, and the contact opening exposes at least a part of the epitaxial structure; and
   performing a wet etching process after the dry etching process, wherein the wet etching process removes the patterned hard mask layer and the second dielectric layer together.

2. The manufacturing method according to claim 1, wherein an etchant used in the wet etching process comprises sulfuric acid and hydrogen peroxide.

3. The manufacturing method according to claim 1, wherein at least a part of the second dielectric layer remains on the substrate at an initial stage of the wet etching process.

4. The manufacturing method according to claim 1, wherein there is not any ash process performed in the dry etching process or performed between the dry etching process and the wet etching process.

5. The manufacturing method according to claim 1, further comprising:
   performing a first wet clean process after the wet etching process; and
   forming a contact structure in the contact opening after the first wet clean process, wherein the contact structure is electrically connected to the epitaxial structure, and a solution used in the first wet clean process comprises ammonium hydroxide and hydrogen peroxide.

6. The manufacturing method according to claim 5, further comprising:
   performing a second wet clean process after the first wet clean process and before the step of forming the contact structure, wherein a solution used in the second wet clean process comprises dilute hydrofluoric acid (DHF).

7. The manufacturing method according to claim 1, further comprising:
   performing a pre clean process after the dry etching process and before the wet etching process, wherein a solution used in the pre clean process comprises ammonium hydroxide and hydrogen peroxide.

8. The manufacturing method according to claim 7, wherein at least a part of the second dielectric layer remains on the substrate after the pre clean process and before the wet etching process.

9. The manufacturing method according to claim 1, wherein the second dielectric layer comprises an organic dielectric layer.

10. The manufacturing method according to claim 1, wherein the second dielectric layer comprises an anti-reflecting dielectric layer.

11. The manufacturing method according to claim 1, wherein the epitaxial structure comprises a silicon phosphate (SiP) epitaxial structure or a silicon germanium (SiGe) epitaxial structure.

12. The manufacturing method according to claim 1, wherein the patterned hard mask layer comprises a metal nitride hard mask layer.

13. The manufacturing method according to claim 1, wherein the substrate comprises a fin structure, and the epitaxial structure is formed on the fin structure.

\* \* \* \* \*